(12) United States Patent
Terui

(10) Patent No.: US 6,534,879 B2
(45) Date of Patent: Mar. 18, 2003

(54) SEMICONDUCTOR CHIP AND SEMICONDUCTOR DEVICE HAVING THE CHIP

(75) Inventor: Makoto Terui, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 63 days.

(21) Appl. No.: 09/789,610

(22) Filed: Feb. 22, 2001

(65) Prior Publication Data
US 2001/0017411 A1 Aug. 30, 2001

(30) Foreign Application Priority Data
Feb. 25, 2000 (JP) ........................................ 2000-049717

(51) Int. Cl.⁷ ........................... H01L 29/40; H01L 23/52
(52) U.S. Cl. .................... 257/786; 257/691; 257/784
(58) Field of Search ................................. 257/786, 691, 257/787, 693, 690, 781, 782, 784

(56) References Cited

U.S. PATENT DOCUMENTS

| | | | | |
|---|---|---|---|---|
| 5,155,065 A | * | 10/1992 | Schweiss | 438/612 |
| 5,347,150 A | * | 9/1994 | Sakai et al. | 257/203 |
| 6,221,690 B1 | * | 4/2001 | Taniguchi et al. | 438/106 |
| 6,242,814 B1 | * | 6/2001 | Bassett | 257/786 |

FOREIGN PATENT DOCUMENTS

JP           5-152489         *  6/1993    .................. 257/700

* cited by examiner

Primary Examiner—Jasmine J B Clark
(74) Attorney, Agent, or Firm—Junichi Mimura

(57) ABSTRACT

A semiconductor chip includes a main surface having a plurality of sides, a plurality of signal electrodes formed on the main surface along the sides, the signal electrodes along one of the sides being disposed in a first area having a first length. The chip further includes a power supply electrode formed on the main surface along the sides, the power supply electrode along the one of the sides being disposed in a second area having the second length, which is longer than the first length, between the one of sides and the signal electrodes.

36 Claims, 7 Drawing Sheets

SEMICONDUCTOR CHIP AND SEMICONDUCTOR DEVICE HAVING THE CHIP

CROSS-REFERENCE TO RELATED APPLICATION

This application claims the priority benefit of Japanese Patent Application No. 2000-49717, filed Feb. 25, 2000, the entire disclosure of which is incorporated herein by reference.

BACKGROUND OF THE INVENTION

1. Field of the Invention

The invention relates to a semiconductor chip having a plurality of electrodes on its main surface and, more specifically, to such a semiconductor chip being suitable for a BGA (Ball Grid Array) type semiconductor device. The invention also relates to a BGA type semiconductor device having the semiconductor chip.

2. Description of the Related Art

Great technological advances have occurred in electrical equipment such as cellular phones using electrical circuits or electrical devices. A semiconductor device is used in most of these electrical circuits or electrical devices.

Because of a great progress of the electrical equipment regarding its function, the semiconductor device should have multi-function features, so that the number of terminals, which are formed on the semiconductor device, are increased wherein the terminals receive input signals from an external device or output signals to the external device.

Generally, it has been required that the size or the weight of the electrical equipment be reduced. For example, the size and the weight of cellular phones are reduced year after year. Therefore, to meet this requirement, it is also required that the size of the semiconductor device within the electrical equipment be reduced. To satisfy this requirement for the semiconductor device, a BGA-type semiconductor device has been developed.

The BGA-type semiconductor device includes a substrate having opposite first and second surfaces. A plurality of terminals are formed on both surfaces. On the first surface, a plurality of ball electrodes, which are formed of a metallic material such as solder are formed on the terminals. Each ball electrode is connected electrically to one of the terminals formed on the second surface by an internal wire formed in the substrate.

A semiconductor chip includes opposite front-main and back surfaces. The semiconductor chip is mounted at a predetermined location on the second surface of the substrate wherein the back surface is facing to the second surface of the substrate. On the main surface of the semiconductor chip, a plurality of electrodes, which are for connecting to the power supply or ground and for inputting or outputting signals, are formed. Each electrode on the main surface of the semiconductor chip is connected to one of the terminals on the second surface of the substrate by a bonding wire. The semiconductor chip and the bonding wires are sealed by insulating material.

Compared to other semiconductor device's structures, such as the DIP (Dual In-line Package) or the QFP (Quad flat package), the BGA type semiconductor device can have more electrodes without enlarging its size because the electrodes can be disposed in a two-dimensional array. Further, to cope with problems resulting from the increased number of the electrodes on the main surface of the semiconductor chip, the electrode is disposed in two lines with a zigzag configuration. The BGA type semiconductor device is mounted on a motherboard so that the ball electrodes are electrically connected to a print circuit formed on the motherboard.

Generally, while there are many electrodes on the chip, which are used for the power supply electrodes and for the ground electrodes, one of the terminals on the substrate is used for the power supply terminal, and one of the terminals on the substrate is used for the ground terminal in the BGA type semiconductor device because the number of terminals being formed on the substrate is restricted. Therefore, the ground terminal is open-rectangular-frame-shaped, and it encompasses a chip-mount area of the substrate. Further, the power supply terminal is also open-rectangular-frame-shaped, and it encompasses the flame-shaped ground terminal. A plurality of I/O signal terminals are disposed in a line, or in two lines with a zigzag configuration, along the outside of the frame-shaped power supply terminal.

However, in this configuration of the electrodes and terminals, there is a problem to be solved in order to avoid their contacts with bonding wires. That is, since the frame-shaped ground terminal on the substrate is disposed at a location closer to the semiconductor chip than the locations of other terminals, the electrodes on the semiconductor chip for the ground connection should be disposed at the outside line of the two lines closer to the side of the semiconductor chip than the inside line. Therefore, the outside line of the electrodes on the semiconductor chip of the two lines with the zigzag configuration includes the power supply electrodes, the ground electrode and the I/O signal electrodes. As a result, the number of the electrodes in the outside line is more than that in the inside line, which is close to the center of the semiconductor chip than the outside line.

According to this configuration, an arrangement of the electrodes on the semiconductor chip is very restricted. This causes an arrangement of the terminals on the substrate to be very restricted also. When the arrangements of both electrodes and terminals are restricted, the number of the ball electrodes is also restricted. If the number of the ball electrodes will not be restricted, a pitch between electrodes or a pitch between terminals becomes very tight as the number becomes large. As a result, it is difficult to avoid their contacts with bonding wires.

SUMMARY OF THE INVENTION

An objective of the invention is to provide a semiconductor chip that improves the design flexibility as to an arrangement of electrodes.

Another objective of the invention is to provide a semiconductor device having the semiconductor chip, which improves the design flexibility as to an arrangement of the electrodes.

Yet another objective of the invention is to provide a semiconductor chip capable of having an increased number of terminals.

A further objective of the invention is to provide a semiconductor device having the semiconductor chip capable of having an increased number of terminals.

According to one aspect of the invention, to achieve one or more of the objectives described above, a semiconductor chip includes a main surface having a plurality of sides, a plurality of signal electrodes formed on the main surface along the sides, the signal electrodes along one of the sides being disposed in a first area of a first length, and a power supply electrode formed on the main surface along the sides, the power supply electrode along the one of the sides being disposed in the second length, which is longer than the first length, between the one of sides and the signal electrodes.

According to another aspect of the invention, to achieve one or more of the objectives described above, a semiconductor device includes a substrate and a semiconductor chip. The substrate includes opposite first and second surfaces, the second surface including a chip-mounting area where the semiconductor chip is mounted, a plurality of signal terminals formed on the second surface at the outside of the chip-mounting area, a power supply terminal formed on the second surface between the chip-mounting area and the signal terminals, and a ground terminal formed on the second surface between the chip-mounting area and the signal terminals. The semiconductor chip includes a main surface having a plurality of sides, a plurality of signal electrodes formed on the main surface along the sides, the signal electrodes along one of the sides being disposed in a first area of a first length, and each signal electrode being connected to one of the signal terminals electrically, and a power supply electrode formed on the main surface along the sides, the power supply electrode along the one of the sides being disposed in a second area of the second length, which is longer than the first length, between the one of the sides and the signal electrodes, and the power supply electrode being connected to the power supply terminal.

The above and further objects and novel features of the invention will more fully appear from the following detailed description, appended claims and accompanying drawings.

DETAILED DESCRIPTION OF THE PREFERRED EMBODIMENTS

First Preferred Embodiment

Figure 1:
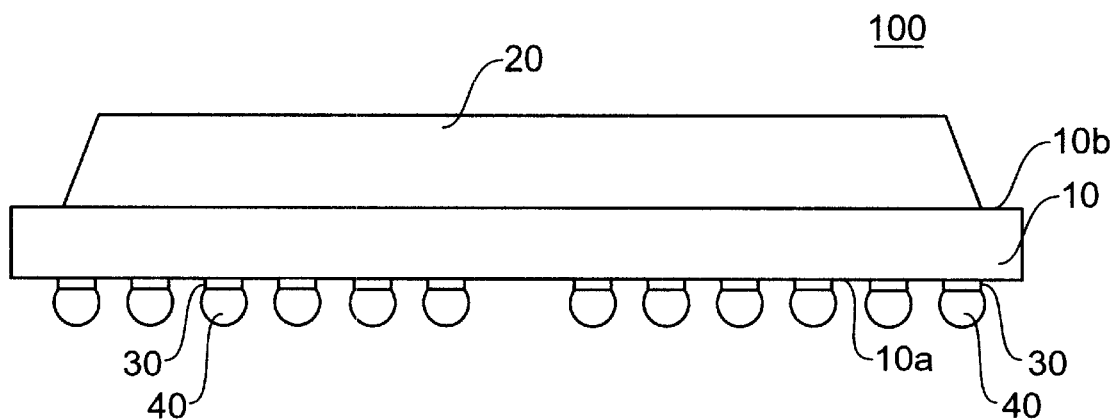
FIG. 1 is a side view of a semiconductor device to which the invention is applied.

The first preferred embodiment is explained by way of example, with reference to an over-molded type structure as follows. Referring to FIG. 1, the semiconductor device 100 includes a substrate 10 having opposite first and second surfaces 10a, 10b. A plurality of pads 30 for connections, which are disposed in a two-dimensional array, are formed on the first surface 10a. A ball electrode 40, which is formed of a metallic conductive material such as solder, is formed on each pad 30. The second surface 10b is concealed by a resin 20. A semiconductor chip 60 on which integrated circuits are formed, is disposed in the resin 20.

Figure 2:
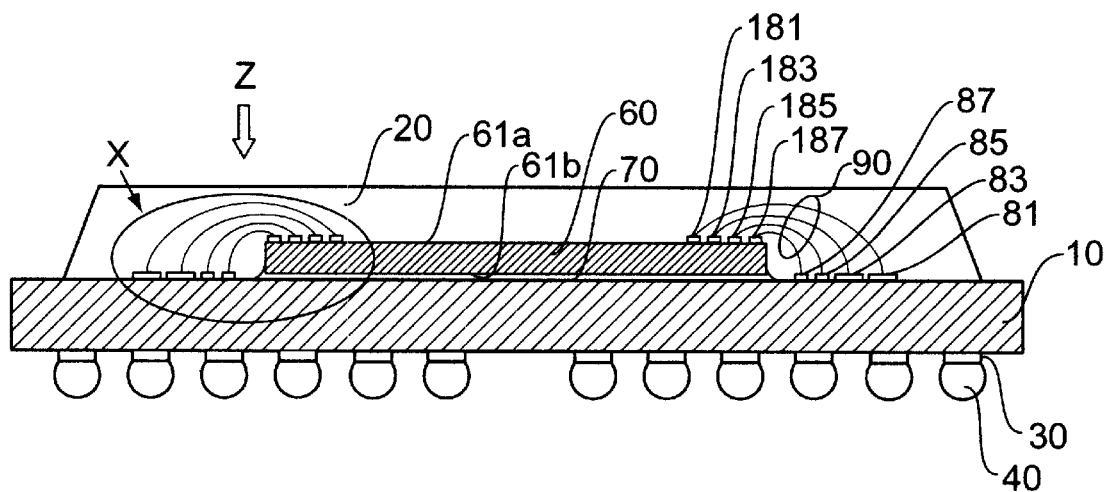
FIG. 2 is a cross-sectional view of a semiconductor device according to a first embodiment of the invention.

Referring to FIGS. 2, 3A and 3B, the semiconductor chip 60 is mounted in a chip-mounting area on the substrate 10. The semiconductor chip 60 includes opposite front-main and back surface 61a, 61b, and the back surface is facing to the second surface 10b of the substrate 10. The semiconductor chip 60 is fixed by an insulating adhesive 70 onto the second surface of the substrate 10. On the second surface of the substrate 10, a plurality of terminals including a plurality of I/O signal terminals 81, 83, a power supply terminal 85 and a ground terminal 87, which are covered in the resin 20 as illustrated, are formed along the each side 60a of the semiconductor chip 60.

The ground terminal 87 is disposed at a location, which is the closest to the semiconductor chip 60. The ground terminal 87 is open-rectangular-flame-shaped, and extends along the outside of the chip-mounting area. As a result, the ground terminal 87 encompasses the chip-mounting area completely. Although the complete frame-shaped ground terminal 87 is used in this embodiment, an incomplete open-rectangular-flame-shaped ground terminal from which a part of the terminal is missed, may be used. The power supply terminal 85 is disposed at a location, which is the second closest to the semiconductor chip 60. The power supply terminal 85 is also open-rectangular-flame-shaped, and extends along the outside of the ground terminal 87. As a result, the power supply terminal 85 encompasses the frame-shaped ground electrode 85 and the chip mounting area completely. Although the complete frame-shaped power supply terminal 85 is used in this embodiment, an incomplete open-rectangular-flame-shaped power supply terminal from which a part of the terminal is missed, may be used. The I/O signal terminals 81, 83 are disposed in two lines with a zigzag configuration along the outside of the frame-shaped power supply terminal 85. In the first line of two, which is located farthest from the semiconductor chip 60, the I/O signal terminals 81 are arranged. In the second line, which is closer to the frame-shaped power supply terminal 85, the I/O signal terminals 83 are arranged.

The substrate 10 is formed of an organic material belonging to a glass epoxy family or of a tape material belonging to polyimide family. Each ball electrode 40 is connected electrically to one of the terminals 81, 83, 85, 87 by an internal conductive layer 95 formed in the substrate 10. Each terminal 81, 83, 85, 87 is formed of copper foil which is plated with nickel or gold.

Each terminal 81, 83, 85, 87 is formed in the following process. First, a sheet of copper foil having a thickness in the range of 12–35 $\mu$mm is spread on the second surface of the substrate 10. Then, The copper foil on areas that the terminals 81, 83, 85, 87 are not formed, is removed by etching. Then, the surface of the copper foil left on the substrate 10 is plated with nickel or gold to avoid being corroded.

The semiconductor chip 60 includes a plurality of electrodes 181, 183, 185 and 187 on its main surface 61a. One of the electrodes is a ground electrode 187 for supplying a ground voltage to the semiconductor chip 60, and it is open-rectangular-frame-shape (details are explained later).

The frame-shaped ground electrode 187 is extended along the sides 60a of the semiconductor chip 60. Another of the electrodes is a power supply electrode 185 for supplying a power supply voltage to the semiconductor chip 60, and it is also open-rectangular-frame-shaped (details are also explained later). The frame-shaped power supply electrode 185 is also extended along the sides 60a of the semiconductor chip 60, and is encompassed by the frame-shaped ground electrode 187 completely. Other electrodes are I/O signal electrodes 181, 183 for inputting or outputting signals. The I/O signal electrodes 181, 183 are disposed in two lines with a zigzag configuration along the inside of the frame-shaped power supply terminal 185 wherein the first line of two is closer to a center of the semiconductor chip 60 than the second line.

Each electrode 181, 183, 185 and 187 on the semiconductor chip 60 is connected electrically to one of the terminals 81, 83, 85 and 87 on the substrate by a wire or wires 90, each which has a diameter in a range of 18–30 µm. Although almost all of the surfaces 61a, 61b of the semiconductor chip 60 is covered by an insulating passivation layer to protect the integrated circuit formed thereon, the surface of each electrode 181, 183, 185 and 187 is exposed to make a connection to an external device such as the substrate 10.

Referring to FIG. 3A, the I/O signal terminals 81, 83 are disposed in the two lines with the zigzag configuration along the side 60a of the semiconductor chip 60 on the substrate 10 as described before. The frame-shaped power supply terminal 85 is disposed on the substrate 10 as encompassing the semiconductor chip 60. The frame-shaped ground terminal 87, which is encompassed by the frame-shaped power supply terminal 85, is disposed on the substrate 10 as encompassing the semiconductor chip 60.

On the other hand, the frame-shaped ground electrode 187 is disposed on the semiconductor chip 60 along the sides 60a of the semiconductor chip 60 as encompassing the center area of the semiconductor chip 60. The frame-shaped power supply electrode 185, which is encompassed by the frame-shaped ground electrode 187, is disposed on the semiconductor chip 60 along the sides 60a of the semiconductor chip 60 as encompassing the center area of the semiconductor chip 60. A plurality of I/O signal electrodes, which are encompassed by the frame-shaped power supply electrode 185, are disposed on the semiconductor chip 60 in two lines with the zigzag configuration along the sides 60a of the semiconductor chip 60. The I/O signal electrodes 181,183 disposed along one of the sides 60a, are arranged in a first area of a first length. The flame-shaped power electrode 185 disposed along the one of the sides 60a, is arranged in a second area of a second length, which is longer than the first length, as shown in FIG. 3A. The flame-shaped ground electrode 187 disposed along the one of the sides 60a, are arranged in a third area of a third length, which is longer than the first and the second length, as shown in FIG. 3A.

As shown in FIG. 3B, the ground terminal 87, the power supply terminal 85, the I/O signal terminals 81 in the first line, and the I/O signal terminals 83 in the second line are connected to the ground electrode 187, the power supply electrode 185, the I/O signal electrodes 181 in the first line, and the I/O signal electrodes 183 in the second line, respectively.

The relationship of the connection described above is summarized as follows. The ground terminal 87 being disposed at an area closer to a center of the substrate 10 than other area at which other terminal are disposed, is connected to the ground electrode 187 being disposed at the third area which is the closest to the side 60a of the semiconductor chip 60. The power supply terminal 85 being disposed at an area, which is the second closest to the center of the substrate 10, is connected to the power supply electrode 185 being disposed at the second area, which is the second closest to the side 60a of the semiconductor chip 60. Each I/O signal terminal 83 in the second line being disposed at a region in an area, which is the third closest location to the center of the substrate 10, is connected to one of the I/O signal electrode 183 in the second line being disposed at a second first region in the first area, which is the third closest to the side 60a of the semiconductor chip, and each I/O signal terminal 81 in the first line being disposed at a region in an area, which is the furthest from the center of the substrate 10, is connected to one of the I/O signal electrode 181 in the first line being disposed at a first region in the first area, which is the furthest from the side 60a of the semiconductor chip 60.

According to these configuration of the electrodes formed on the semiconductor chip 60, since the ground electrode 187 and the power supply electrode 185 are not mixed to the I/O signal electrodes 181, 183 in the same line, that is, both the ground electrode 187 and the power supply electrode 185 are disposed in the different area where the I/O signal electrodes 181, 183 are disposed, it is possible to reduce the possibility of unexpected contacts with the bonding wires 90. That is, since both electrodes and terminals are disposed in the different areas based on their functions, each connection can be performed by the bonding wire 90 with different height of the bonding loop. As a result, the unexpected contacts with the bonding wires 90 can be reduced. The most effective ways for making connections between terminals and electrodes by the bonding wires 90 to avoid the unexpected contacts with bonding wires 90 are as follows. The height of the bonding loop being used for the connection between the ground terminal 87 and the ground electrode 187 should be lowest, and the height of the bonding loop being used for the connection between the ground terminal 85 and the ground electrode 185 should be the second lowest. Further, the heights of the bonding loops being used for the connections between the I/O signal terminals 83 in the second line and the I/O signal electrodes 183 in the second line should be the third lowest, and the heights of the bonding loops being used for the connections between the I/O signal terminals 81 in the first line and the I/O signal electrodes 181 in the first line should be higher than those of other wires.

Furthermore, according to the first embodiment, since both ground electrode 187 and power supply electrode 185 are not disposed in the second and the third area which is different from the first area where I/O signal electrodes 181, 183 are disposed, the number of the I/O signal electrodes 181, 183 can be increased. Moreover, since both ground electrode 187 and power supply electrode 185 are frame-shaped, there are no restriction as to the connecting location of the bonding wires or the number of the bonding wires for using the connection between the ground electrode 187 and the ground terminal 87 or between the power supply electrode 185 and the power supply terminal 85. Therefore, the ground electrode 187 and the ground terminal 87 or the power supply electrode 185 and the power supply terminal 85 can be connected by the bonding wires at any locations and with any numbers as desired. Since it is possible to select locations on the ground electrode 187, on the ground terminal 87, on the power supply electrode 185 and on the power supply terminal 85 on which there is enough space for wire-bonding, the design flexibility of the wire bonding is improved.

As described above, each ball electrode 40 is connected to one of the terminals 81, 83, 85, 85 by the internal wire 95 formed in the substrate 10 as shown in FIG. 3B. In this figure, it seems that the internal wires 95 are connected because it shows the sectional view. However, each internal wire is independent and is not connected to other internal wires.

Figure 4:
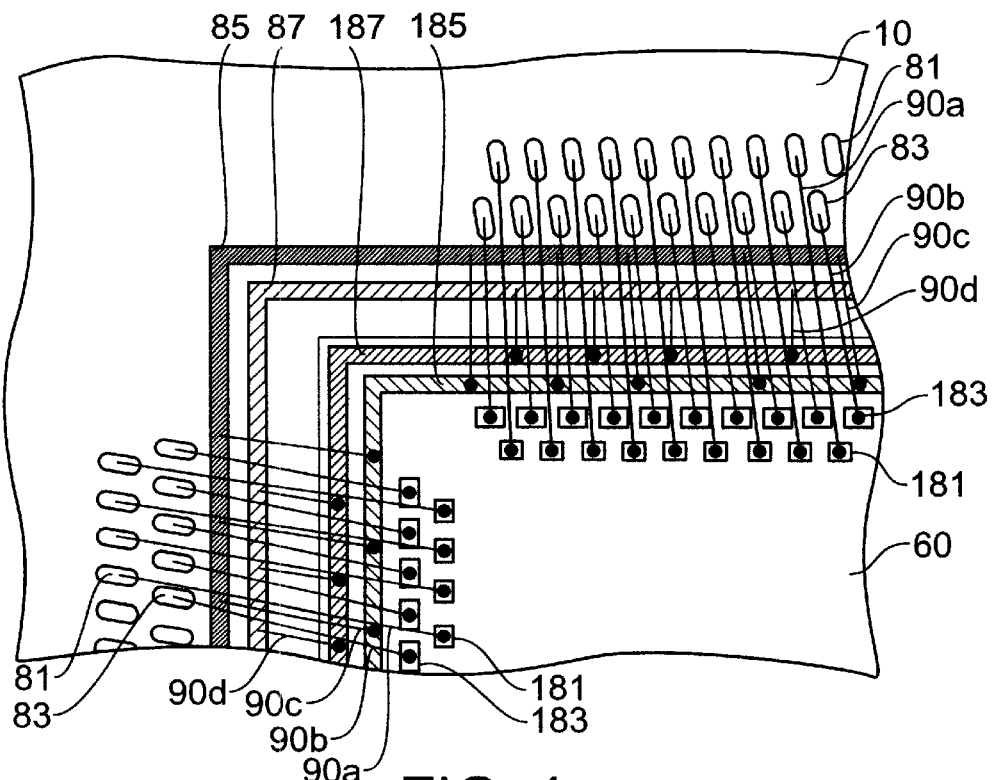
FIG. 4 is an enlarged plan view of the semiconductor device of FIG. 3A.

Referring to FIG. 4, a plurality of bonding wires are formed to connect the electrodes disposed on the semiconductor chip 60 to the terminals disposed on the substrate 10. The ground electrode 187 is connected to the ground terminal 87 by a plurality of bonding wires 90*d*. The power supply electrode 85 is connected to the power supply terminal 85 by a plurality of bonding wires 90*c*. The connection between the ground terminal 87 and the ground electrode 187 may be made by a single bonding wire, and the connection between the power supply terminal 85 and the power supply electrode 187 also may be made by a single bonding wire. However, when these connections are made by the plurality of bonding wires 90*c* or 90*d*, influence of inductance that the bonding wire has can be reduced. Therefore, when these connections are made by the plurality of bonding wires 90*c* or 90*d*, noise caused by the inductance can be reduced. Further, if one of the bonding wires 90C, 90*d* is disconnected by an accident, the operation of the integrated circuit formed on the semiconductor chip 60 can be compensated by supplying the ground voltage or the power supply voltage through other bonding wires. In addition, the supply of the ground voltage or the power supply voltage can be strengthened.

Each I/O signal terminal 183 disposed in the second line is connected to one of the I/O signal electrodes 83 disposed in the second line by a bonding wire 90*b*. Each I/O signal terminal 181 disposed in the first line is connected to one of the I/O signal electrodes 81 disposed in the first line by a bonding wire 90*a*. Each I/O signal terminal 183 disposed in the second line may be connected to one of the I/O signal electrodes 81 disposed in the first line by a bonding wire, and each I/O signal terminal 181 disposed in the first line may be connected to one of the I/O signal electrodes 83 disposed in the second line by a bonding wire, if there is no contact with bonding wires.

To dispose the power supply electrode 185 as FIGS. 3A and 3B show, parts of the integrated circuit in the semiconductor chip 60 where the power supply voltage is supplied, are connected commonly by internal wires. Then, the internal wires commonly connected, are connected to the power supply electrode 185 electrically via buried electrical layers, which are formed in through-holes formed in an insulating layer and the passivation layer on the integrated circuit. Further, to dispose the ground electrode 187 as FIGS. 3A and 3B show, parts of the integrated circuit in the semiconductor chip 60 where the ground voltage is supplied, are connected commonly by internal wires. Then, the internal wires commonly connected, are connected to the ground electrode 185 electrically in the same manner. According to these manners of the connections performed by the internal wires, the design flexibility of the configuration of the integrated circuits in the semiconductor chip 60 is improved.

In this embodiment, although both frame-shaped ground electrode 187 and frame-shaped power supply electrode 185 are disposed in the second and the third areas which are different from the first area where the I/O signal electrodes 181, 183 are disposed, only one of the ground electrode 187 and the power supply electrode 185 may be open-rectangular-frame-shaped and the other is not flame-shaped, and is disposed in the first area where the I/O signal electrodes are disposed, in order to satisfy the design flexibility of arrangement of electrodes or the requirement for increasing the terminals. However, it is more effective to dispose both ground electrode 187 and power supply electrode 185 in the second and the third area respectively which are different from first area where the I/O signal electrodes are disposed 181,183, as described in the first embodiment.

Second Preferred Embodiment

Figures 5A, 5B:
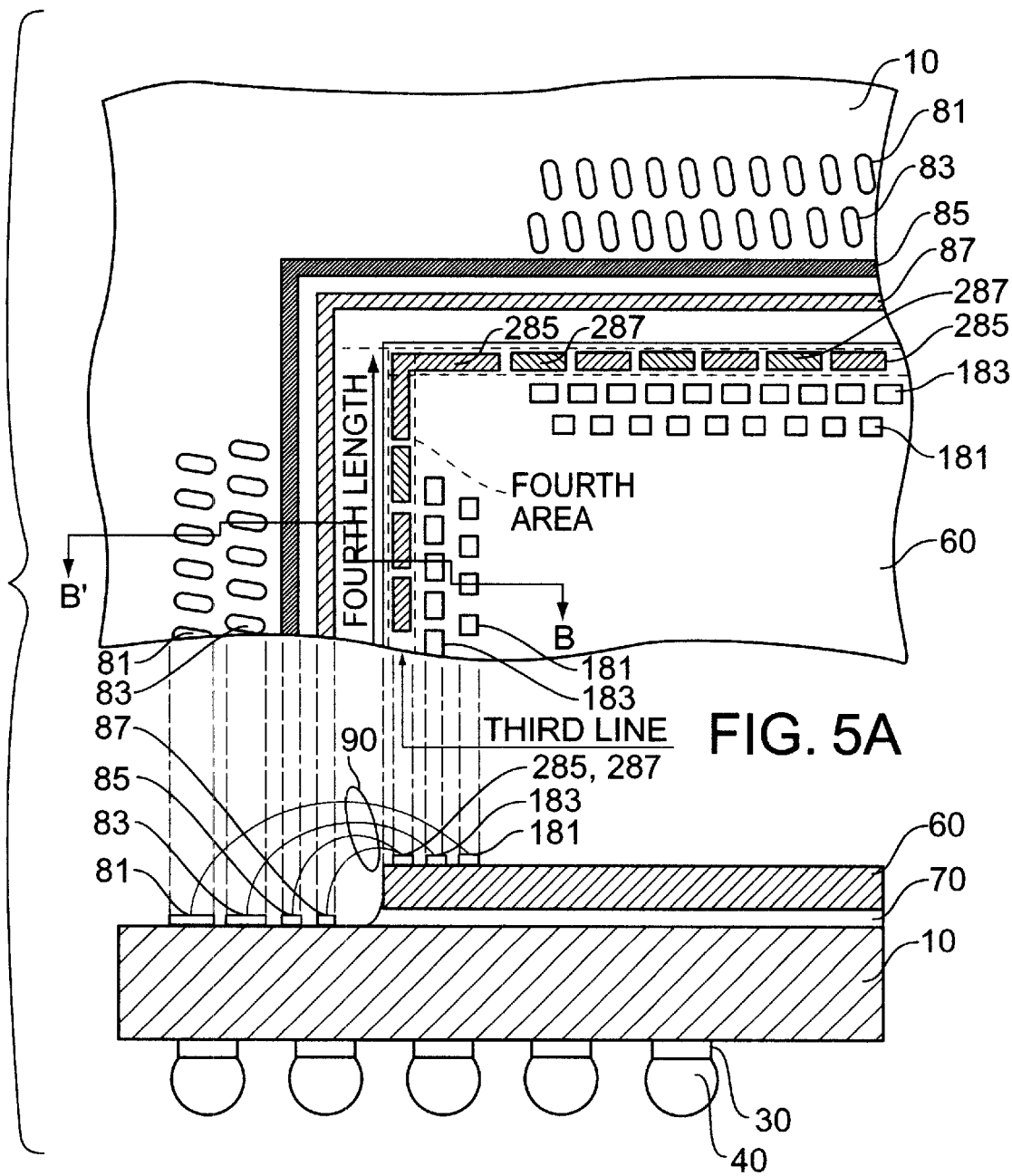
FIG. 5A is an enlarged plan view of the semiconductor device wherein bonding wires are omitted, according to a second embodiment.
FIG. 5B is cross-sectional view of the semiconductor device, taken along line B–B' shown in FIG. 5A.

The second embodiment of the invention is explained with reference to FIGS. 5A, 5B and 6. The same reference numbers used in the drawings designate the same or similar components. In FIG. 5A, bonding wires illustrated in FIG. 6 are omitted as well as in FIG. 3A.

As shown in FIG. 5A, a plurality of ground electrodes 287 and a plurality of power supply electrodes 285 are disposed alternatingly in a line, which is called a third line. These electrodes 287, 285 are disposed along a side 60*a* of a semiconductor chip 60 as they encompass a center of the semiconductor chip 60. The ground electrode 287 and the power supply electrode 285 disposed along the one of the sides 60*a*, are arranged in a fourth area of a fourth length, which is longer than the first length for the first area in which the I/O signal electrodes are disposed.

As shown in FIG. 5B, the power supply electrodes 285 are connected electrically to a power supply terminal 85 formed on the substrate 10 by bonding wires 90. The ground electrodes 287 are connected electrically to a ground terminal 87 formed on the substrate 10 by bonding wires 90. Other components shown in FIGS. 5A and 5B are similar to those shown in FIGS. 3A and 3B.

Figure 6:
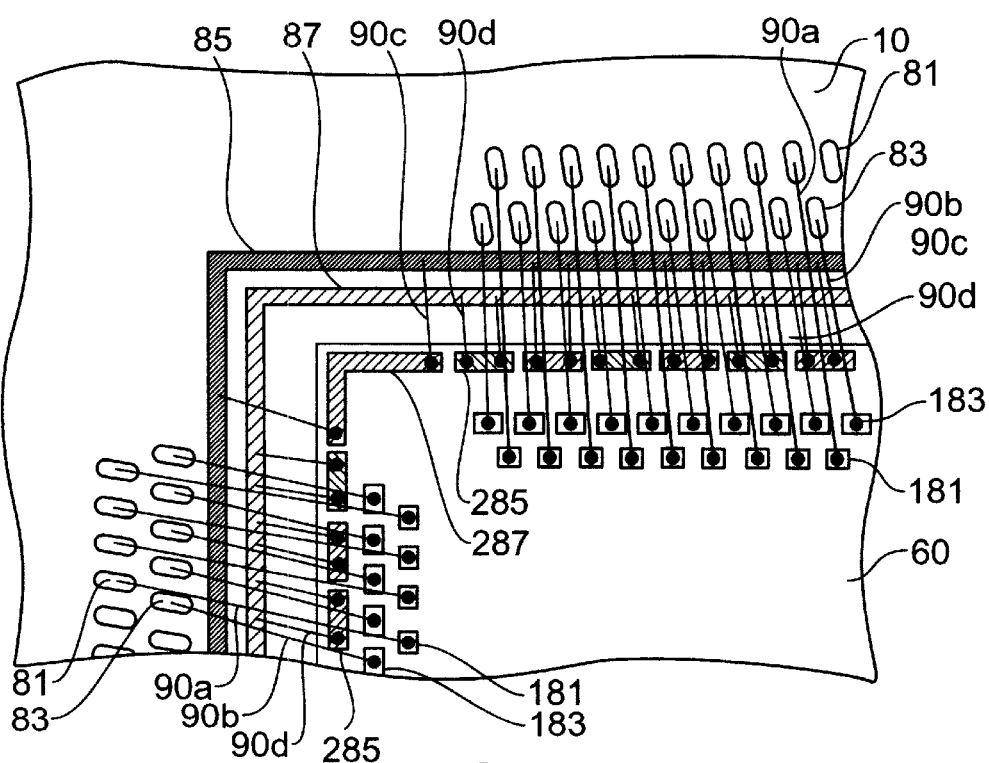
FIG. 6 is an enlarged plan view of the semiconductor device of FIG. 5A.

Referring to FIG. 6, a plurality of bonding wires are formed to connect the electrodes disposed on the semiconductor chip 60 to the terminals disposed on the substrate 10. Each ground electrode 287 is connected to the ground terminal 87 by a plurality of bonding wires 90*d*. Each power supply electrode 285 is also connected to the power supply terminal 85 by a plurality of bonding wires 90*c*. The connection between the ground terminal 87 and each of the ground electrodes 287 may be made by a single bonding wire, and the connection between the power supply terminal 85 and each of the power supply electrodes 187 also may be made by a single bonding wire. However, when these connections are made by the plurality of bonding wires 90*c* or 90*d*, influence of inductance that the bonding wire has can be reduced. Therefore, when these connections are made by the plurality of bonding wires 90*c* or 90*d*, noise caused by the inductance can be reduced. Further, if one of the bonding wires 90C, 90*d* in each connection is disconnected by an accident, the operation of an integrated circuit formed on the semiconductor chip 60 can be compensated by supplying the ground voltage or the power supply voltage through other bonding wires. In addition, the supply of the ground voltage or the power supply voltage can be strengthened.

As well as described in the first embodiment, each power supply electrode 285 is connected parts of the integrated circuit in the semiconductor chip 60 where the power supply voltage is supplied, via buried electrical layers, which are formed in through-holes formed in an insulating layer on the integrated circuit or the passivation layer. If there is a space in a wiring region in the semiconductor chip 60 enough to form extra internal wires, the power supply electrodes 285 may be connected to each other by the extra internal wires. When the power supply electrodes 285 is connected to each other by the extra internal wires, following advantages are expected. When it is difficult to make a connection between the power supply electrode 285 and the power supply terminal 85 in a particular area without unnecessary contacts with bonding wires as a result of the connections between an I/O signal terminal in a first line or a second line and an I/O signal electrodes in a first line or a second line being made, it may not be necessary to make a connection between the power supply electrode 285 and the power supply terminal 85 in this particular area, because other power supply electrodes, which are connected to the power supply electrode by the extra internal wires, are connected to the power supply terminal 87 by the bonding wires 90.

On the other hand, when the power supply electrodes 285 is not connected to each other by the extra internal wires, that is each power supply electrode 285 is connected to one of the parts of the integrated circuit in the semiconductor chip 60 where the power supply voltage is supplied, it is not necessary to form the extra internal wires and to secure the region to form the internal wires, of cause. Therefore, the high design-flexibility of the configuration of the integrated circuits can be expected. Although the forgoing description relates to the power supply electrode 285, it also can be applied to the ground electrode 285.

According to the second embodiment, in addition to the benefits of the first embodiment, the following benefit can be obtained. Compared with the semiconductor chip including the ground electrode 187 and the power supply electrode 185 formed in the first and second area in the first embodiment, since the a plurality of ground electrodes 287 and a plurality of power supply electrodes 285 are disposed alternatingly in a line in the fourth area, the semiconductor chip can be shrunken.

Third Preferred Embodiment

Figures 7A, 7B:
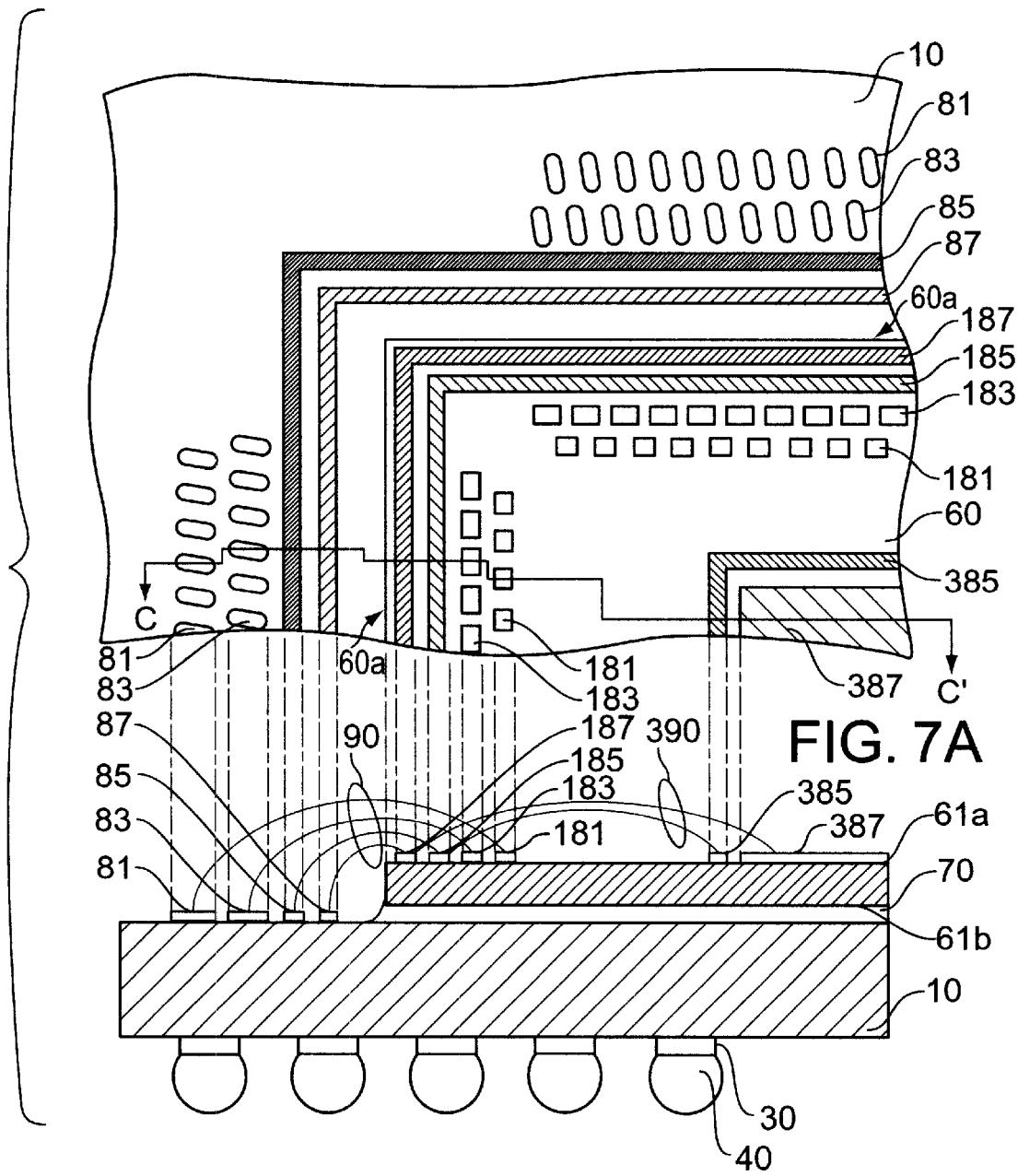
FIG. 7A is an enlarged plan view of the semiconductor device wherein bonding wires are omitted, according to a third embodiment.
FIG. 7B is cross-sectional view of the semiconductor device, taken along line C–C' shown in FIG. 7A.

The third embodiment of the invention is explained with reference to FIGS. 7A, 7B, 8 and 9. The same reference numbers used in the FIGS. 3A and 3B designate the same or similar components. However, the electrode called the frame-shaped power supply electrode 185 is called the first power supply frame-shaped electrode 185 in the third embodiment. In FIG. 7A, bonding wires illustrated in FIG. 9 are omitted as well as in FIGS. 3A or 5A.

Figure 3:
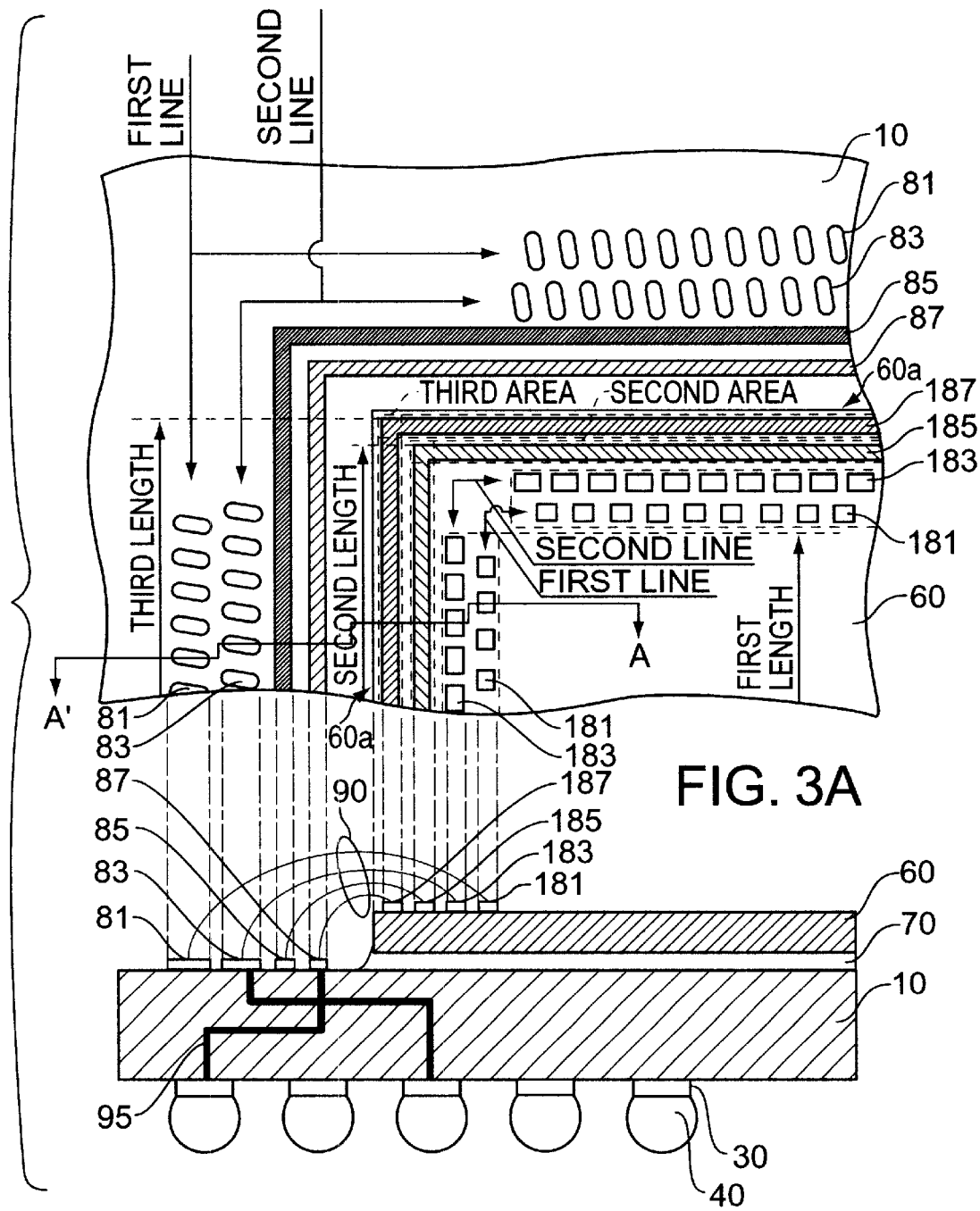
FIG. 3A is an enlarged plan view at an area A of the semiconductor device of FIG. 2 wherein bonding wires are omitted.
FIG. 3B is cross-sectional view of the semiconductor device, taken along line A–A' shown in FIG. 3A.
Figure 8:
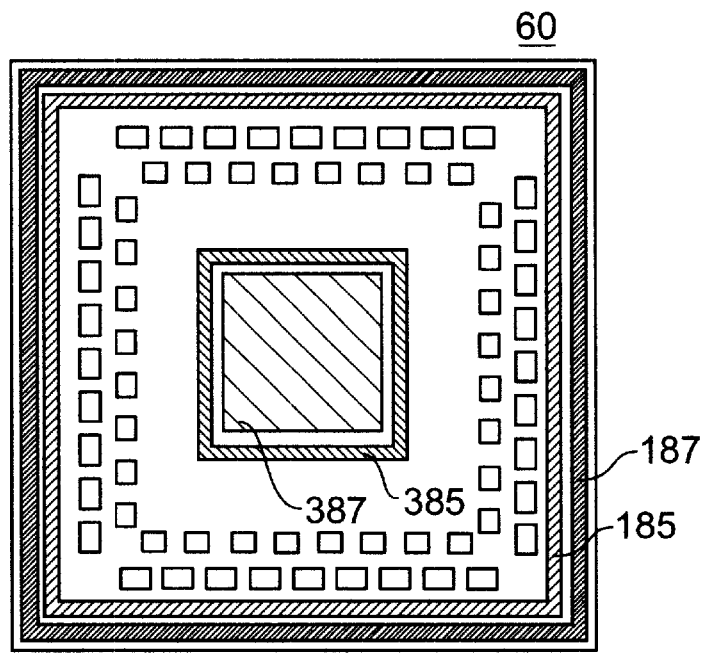
FIG. 8 is a plan view of a semiconductor chip, according to the third embodiment of the invention.

As shown in FIGS. 7A and 8, the semiconductor chip 60 further includes a rectianguraily-shaped ground electrode 387 and a second open-rectangular-frame-shaped power supply electrode 385, in addition to the components of the semiconductor chip shown in FIG. 3. The second frame-shaped power supply electrode 385 is extended along the sides of the rectianguraily-shaped ground electrode 387, and encompasses the rectianguraily-shaped ground electrode 387 completely. The ground electrode 387 has a similar shape of the semiconductor chip 10, and is located on at a center on the main surface 61 a of the semiconductor chip 10. The second power supply electrode 385 encompasses the ground electrode 387. Other components shown in FIGS. 7A and 7B are similar to those shown in FIGS. 3A and 3B.

Referring to FIG. 7B, the second power supply electrode 385 is connected to the first power supply electrode 185 electrically by bonding wires 390, and the rectianguraily-shaped ground electrode 387 is connected to a frame-shaped ground electrode 187 electrically by bonding wires 390.

Figure 9:
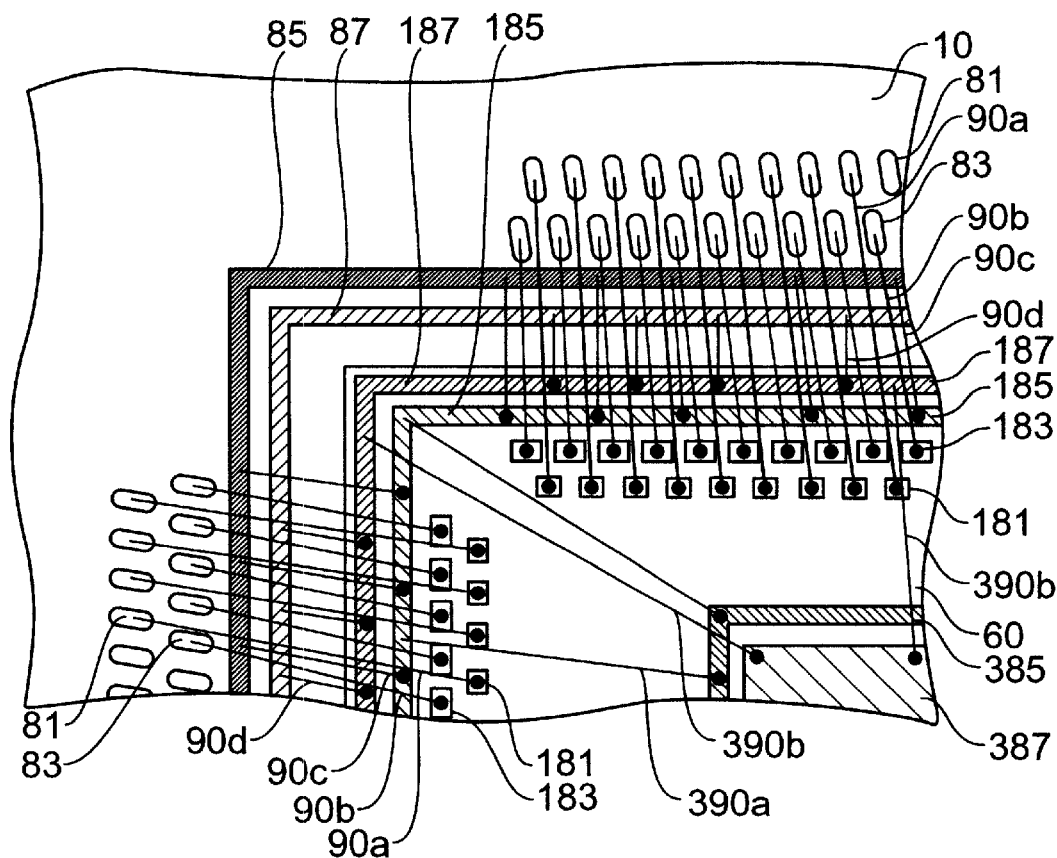
FIG. 9 is an enlarged plan view of the semiconductor device of FIG. 7A.

Referring to FIG. 9, the second power supply electrode 385 is connected to the first power supply electrode 185 by a plurality of bonding wires 390a. Also, the rectianguraily-shaped ground electrode 387 is connected to the frame-shaped ground electrode 187 by a plurality of bonding wires 390b. They may be connected to each other by a single bonding wire, respectively. However, when these connections are made by the plurality of bonding wires 390a or 390b, influence of inductance that the bonding wire has can be reduced. Therefore, when these connections are made by the plurality of bonding wires 390a or 390b, noise caused by the inductance can be reduced. Further, if one of the bonding wires 390a, 390b is disconnected by an accident, the operation of the integrated circuit formed on the semiconductor chip 60 can be compensated by supplying the ground voltage or the power supply voltage through other bonding wires. In addition, the supply of the ground voltage or the power supply voltage can be strengthened.

To dispose the second power supply electrode 385 as FIGS. 7A, 7B, 8 and 9 show, parts of the integrated circuit in the semiconductor chip 60 where the power supply voltage is supplied, are connected commonly by internal wires. Then, the internal wires commonly connected, are connected to the second power supply electrode 385 electrically via buried electrical layers, which are formed in through-holes formed in an insulating layer and the passivation layer on the integrated circuit. Further, to dispose the rectianguraily-shaped ground electrode 387 as FIGS. 7A, 7B, 8 and 9 show, parts of the integrated circuit in the semiconductor chip 60 where the ground voltage is supplied, are connected commonly by internal wires. Then, the internal wires commonly connected, is connected to the ground electrode 185 electrically in the same manner. According to these manners of the connections performed by the internal wires, the high design-flexibility of the configuration of the integrated circuits is expected. Further, to avoid the unintentional contacts with bonding wires 390, the height of the bonding loop being used for the connection between the frame-shaped ground electrode 187 and the rectianguraily-shaped ground electrode 387 should be higher that that being used for the connection between the first and second power supply electrodes 185 and 385.

According to the third embodiment, in addition to the benefits of the first embodiment, the following benefit can be obtained. Since the parts of the integrated circuit where the power supply voltage is supplied, which is formed at an area where the center of the semiconductor chip 60 or its neighbors are located, are connected commonly by internal wires, the parts of integrated circuit formed at the area can be connected to the second power supply 385, which is disposed closer than the first power supply electrode 185, by internal wires. When the other parts of the integrated circuit formed at the other area where the power supply voltage is supplied, are connected commonly by other internal wires, the other parts of the integrated circuit formed can be connected to the first power supply electrode 185, which is disposed closer than the second power supply 385, by other internal wires.

Similarly, since the parts of the integrated circuit where the ground voltage is supplied, which is formed at the area where the center of the semiconductor chip 60 or its neighbors are located and, are connected commonly by internal wires, the parts of integrated circuit formed at the area can be connected to the rectianguraily-shaped ground electrode 387, which is disposed closer than the frame-shaped ground electrode 185, by internal wires. When the other parts of the integrated circuit formed at the other area where the ground voltage is supplied, are connected commonly by other internal wires, the other parts of the integrated circuit formed can be connected to the frame-shaped ground electrode 185, which is disposed closer than the rectianguraily-shaped ground electrode 387, by other internal wires.

According to this arrangement of the electrodes 185, 385, 187, 387, while the parts of the integrate circuit formed at the area where the center of the semiconductor chip 60 or its neighbors are located, connect to the first power supply electrode 185 or the frame-shaped ground electrode 187 with elongated and complicated internal wires in the first embodiment, it is not necessary to form elongated and complicated internal wires to supply the ground voltage or the power supply voltage to the parts of the integrate circuit formed at the area where the center of the semiconductor chip 60 or its neighbors are located, because the electrodes 387, 385 is located close to the parts. As a result, a design flexibility of the configuration of the internal wires or the integrated circuits is improved. Further, since low inductance effect can be expected, the stable power supply voltage and the stable ground voltage can be supplied to the semiconductor chip 60.

While the invention has been described with reference to illustrative embodiments, this description is not intended to be construed in a limiting sense. For example, although, both I/O signal electrodes 181, 183 on the semiconductor chip 60 and the signal I/O terminal 81, 83 on the substrate 10 are disposed in two line at zigzag configuration in each embodiment, only one of them is disposed in two line at zigzag configuration in each embodiment.

Further, although the substrate 10 having a plane surface on which all terminals are disposed, a multi-plane substrate can be used. The multi-plan substrate has a cavity at the center of the substrate and at least one plane encompassing the cavity. The semiconductor chip is placed in the cavity, and each of the ground terminals, the power supply terminal and the I/O signal terminal is disposed on one of planes. When the multi-plan substrate is used, unnecessary contacts with the bonding wires and inductance of the bonding wires can be further reduced. Further, when the multi-plan substrate is used, the invention can be applied to not only the over-molded type structure, but also a cavity down structure capable of forming multi-terminals and of radiating heat.

Figure 10:
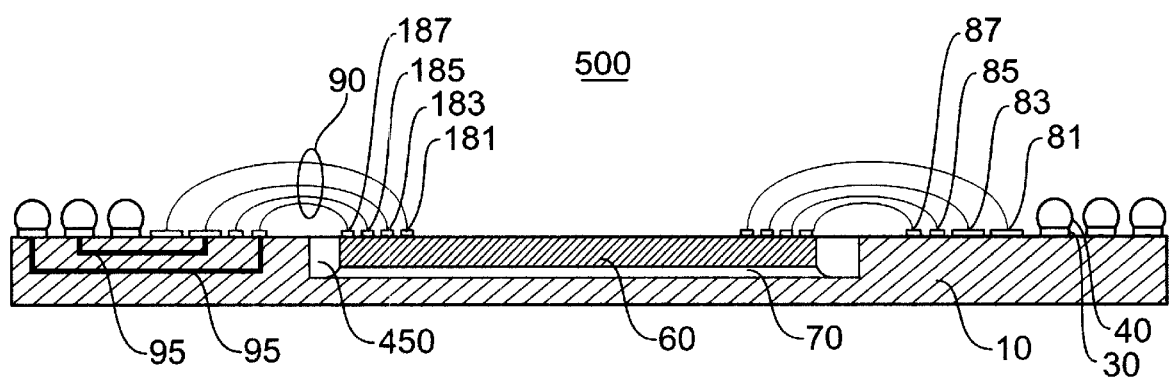
FIG. 10 is a cross-sectional view of an alternative semiconductor device of the first embodiment.

A semiconductor device 500 having the cavity down structure to which the first embodiment of the invention is applied, is explained with reference to FIG. 10. In FIG. 10, the same reference numbers used in the embodiments designate the same or similar components.

The semiconductor device 500 having the cavity down structure includes a substrate 10 having a cavity 450, which is formed at the center of the substrate 10. A semiconductor chip 60 having the electrodes 181, 183, 195, 197, which are disposed as described in the first embodiment, is fixed in the cavity 450 by an adhesive 70. The terminals 81, 83, 85, 87 are disposed in the same configuration as described in each embodiment on the surface of the substrate 10 adjacent to the cavity 450. Each terminal 81, 83, 85, 87 is connected to one of the electrodes 181, 183, 185, 187 of the semiconductor chip 60 by a bonding wire or wires 90. The connections carried out in the semiconductor device shown in FIG. 10 are the same as those carried out in the semiconductor device in each embodiment. That is, the ground terminal 87 is connected to the ground electrode 187 and the power supply terminal 85 is connected to the power supply electrode 185. Each I/O signal terminal 81 in the first line is connected to one of the I/O signal electrodes 181 in the first line, and each I/O signal terminal 83 in the second line is connected to one of the I/O signal electrodes 183 in the second line.

Further a plurality of pads 30 for connections, which are disposed in a two-dimensional array, are formed on the same surface of the substrate 10 that the terminals 81, 83, 85, 87 are disposed. The pads 30 are disposed the outside of where the terminals are formed. A ball electrode 40 is formed on each pad 30, and each ball electrodes is connected to one of terminals 81, 83, 85, 87 electrically via an internal wire 95 formed in the substrate 10. As described above, the invention can be applied to the semiconductor device 500 having the cavity down structure that the ball electrodes 40 are disposed on the same surface of the substrate 10 that the terminals 81, 83, 85, 87 are disposed. As further described above, the case that the semiconductor device having the cavity down structure to which the first embodiment of the invention is applied, is explained as an example, the second or the third embodiment of the invention can be applied to the semiconductor device having the cavity down structure.

Furthermore, although the main surface, bonding wires 90 and terminals 81, 83, 85, 87 are concealed by the resin 20, the invention can be applied to the semiconductor device which is not concealed by the resin. That is, the semiconductor device having a structure that the semiconductor chip, the bonding wires and the terminals may be covered by hermetic sealing members so that the bonding wire can be separated from the outside by the hermetic sealing members.

In the first and/or third embodiment, the first complete flame-shaped power supply electrode 185, the complete frame-shaped ground electrode 187 and the second complete frame-shaped power supply electrode 385 are disclosed. However, a first incomplete open-rectangular-flame-shaped power supply electrode, an incomplete open-rectangular-flame-shaped ground terminal, and a second incomplete open-rectangular-flame-shaped power supply electrode, may be used. That is, each electrode may have a missing part. Although the complete rectianguraily-shaped ground electrode 387 is used in the third embodiment, an incomplete rectianguraily-shaped ground electrode may be used. That is, the incomplete rectianguraily-shaped ground electrode may have a missing part.

In the second embodiment, a plurality of power supply electrodes 285 and a plurality of ground electrodes 287 are disclosed. However, at lease two power supply electrodes and at lease two ground electrodes may be used. When two power supply electrodes and two ground electrodes are used, the one of two power supply electrode is L-shaped and is disposed at one corner of the chip 60. One end of the L-shaped power supply electrode extends to around the middle of one of the side 60a of the chip 60, and the other end also extends to around the middle of another side 60a of the chip 60, which is next to the one of the sides. The other power supply electrode is also L-shaped and is disposed at the diagonal corner. And each end also extends to around the middle of each side 60a of the chip 60. Each ground electrode is also L-shaped and is disposed at one corner. Therefore, the ground electrodes are disposed diagonally. Each end of each ground electrode extends to around the middle of each side 60a of the chip 60.

Moreover, in the first and the second embodiments, since the ground terminal 87 is disposed closer to the chip 60 than the power supply terminal 85, the ground electrode 187 is disposed closer to the side 60a of the chip 60 than the power supply electrode 185. However, the power supply terminal 85 may be disposed closer to the chip 60 than the ground terminal 87. In this case, the power supply electrode 185 should be disposed closer to the side 60a of the chip 60 than the ground electrode 187.

In all embodiments, the insulating adhesive 70 fixes the semiconductor chip 60 on the substrate 10. However, a conductive adhesive may fix the semiconductor chip 60 on the substrate 10. In this case, when the ground terminal 87 is connected to the semiconductor chip 60 by the conductive adhesive, it is easy to supply the ground voltage to a semiconductor substrate of the chip 60. To embody this connection, a rectianguraily-shaped ground terminal, which is larger than the chip 60, or a mesh ground terminal is considered. In both cases, the ground terminal is formed on the substrate as it extends to the back surface 61b of the chip 60. Therefore, the semiconductor chip 60 is fixed by the conductive adhesive, which is formed on the ground terminal. According to this connection, it is possible to fix the semiconductor chip 60 on the substrate 10 stably without increasing any manufacturing steps. Therefore, it is possible to supply the stable ground electrode to the semiconductor substrate of the chip 60. In this connection, it is necessary not to extend the conductive adhesive onto the power supply terminal 85 or the I/O signal terminals 81, 83, which are adjacent to the ground terminal in order to avoid unnecessary contacts with the conductive adhesive. For example, a wall, which encompasses the semiconductor chip 60, may be formed on the ground electrode. The wall can dam up the flow of the conductive adhesive and the conductive adhesive does not reach to the power supply terminal 85 or the I/O signal terminals 81, 83.

When the semiconductor device having the cavity-down structure is used, it is preferable to make the height of the bonding loop lower than the total height of the pad 30 and the ball electrode 40 to avoid cutting or shorting the bonding wires. Further, the main surface of the semiconductor chip 60, the bonding wires 90, and the terminals 81, 83, 85, 87 may be sealed by the resin or may be covered by the hermetic sealing members. When the resin or the hermetic sealing members are used to the semiconductor device having the cavity-down structure, which is assembled to a plan print board, it is preferable to make the height of the resin or the hermetic sealing members lower than the total height of the pad 30 and the ball electrode 40 in order to make a reliable connection between the ball electrodes and the plan print board.

Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A semiconductor chip, comprising:

a main surface having a plurality of sides;

a plurality of signal electrodes formed on the main surface along the sides, the signal electrodes along one of the sides being disposed in a first area having a first length; and a power supply electrode formed on the main surface along the sides, the power supply electrode along the one of the sides being disposed in a second area having the second length, which is longer than the first length, between the one of sides and the signal electrodes.

2. A semiconductor chip as claimed in claim 1, wherein the power supply electrode substantially encompasses the signal electrodes.

3. A semiconductor chip as claimed in claim 1, wherein the power supply electrode is a first power supply electrode, further comprising a second power supply electrode, which is formed on the main surface at an area adjacent to a center area of the semiconductor chip, being connected to the first power supply electrode electrically.

4. A semiconductor chip, comprising:

a main surface having a plurality of sides;

a plurality of signal electrodes formed on the main surface along the sides, the signal electrodes along one of the sides being disposed in a first area having a first length; and a ground electrode formed on the main surface along the sides, the ground electrode along one of the sides being disposed in a third area having a third length, which is longer than the first length, between the one of sides and the signal electrodes.

5. A semiconductor chip as claimed in claim 4, wherein the ground electrode substantially encompasses the signal electrodes.

6. A semiconductor memory as claimed in claim 4, wherein the ground electrode is a first ground electrode, further comprising a second ground electrode, which is formed on the main surface at a center area of the semiconductor chip, being connected to the first ground electrode electrically.

7. A semiconductor chip, comprising:

a main surface having a plurality of sides;

a plurality of signal electrodes formed on the main surface along the sides, the signal electrodes along one of the sides being disposed in a first area having a first length;

a power supply electrode formed on the main surface along the sides, the power supply electrode along the one of the sides being disposed in a second area having a second length, which is longer than the first length, between the one of the sides and the signal electrodes, and a ground electrode formed on the main surface along the sides, the ground electrode along the one of the sides being disposed in a third area having a third length, which is longer than the first length, between the one of the sides and the signal electrodes.

8. A semiconductor chip as claimed in claim 7, wherein the power supply electrode substantially encompasses the signal electrodes.

9. A semiconductor chip as claimed in claim 7, wherein the ground electrode substantially encompasses the signal electrodes.

10. A semiconductor chip as claimed in claim 7, wherein the power supply electrode substantially encompasses the signal electrodes, and wherein the ground electrode substantially encompasses the power supply electrode.

11. A semiconductor chip as claimed in claim 7, wherein the power supply electrode is a first power supply electrode, further comprising a second power supply electrode, which is formed on the main surface at an area adjacent to a center area of the semiconductor chip , being connected to the first power supply electrode electrically.

12. A semiconductor chip as claimed in claim 7, wherein the ground electrode is a first ground electrode, further comprising a second ground electrode, which is formed on the main surface at a center area of the semiconductor chip, being connected to the first ground electrode electrically.

13. A semiconductor chip as claimed in claim 10, wherein the ground electrode is a first ground electrode and the power supply electrode is a first power supply electrode, further comprising a second ground electrode, which is formed on the main surface at a center area of the semiconductor chip, being connected to the first ground electrode electrically; and a second power supply electrode, which is formed on the main surface at an area adjacent to the center area of the semiconductor chip between the first power supply electrode and the second ground electrode, encompassing the second ground electrode, the second power supply electrode being connected to the first power supply electrode.

14. A semiconductor chip, comprising:

a main surface having a plurality of sides;

a plurality of signal electrodes formed on the main surface along the sides, the signal electrodes alone one of the sides being disposed in a first area having a first length;

a plurality of power supply electrodes formed on the main surface along the sides, the power supply electrodes along the one of the sides being disposed between the sides and the signal electrodes, and being disposed in a single line; and a plurality of ground electrodes formed on the main surface along the sides, the ground electrodes along the one of the sides being disposed between the one of the sides and the signal electrodes, and being disposed in the single line, the power supply electrodes and the ground electrodes along the one of the sides being disposed alternatingly in the single line in a fourth area having a fourth length, which is longer than the first length.

15. A semiconductor chip as claimed in claim 14, wherein the power supply electrodes and the ground electrodes substantially encompasses the signal electrodes.

16. A semiconductor chip as claimed in claim 14, wherein the power supply electrodes are first power supply electrodes, further comprising a second power supply electrode, which is formed on the main surface at an area adjacent to a center area of the semiconductor chip, being connected to the first power supply electrodes electrically.

17. A semiconductor memory as claimed in claim 14, wherein the ground electrodes are first ground electrodes, further comprising a second ground electrode, which is formed on the main surface at a center area of the semiconductor chip, being connected to the first ground electrodes electrically.

18. A semiconductor chip as claimed in claim 14, wherein the ground electrodes are first ground electrodes and the power supply electrodes are first power supply electrodes, further comprising a second ground electrode, which is formed on the main surface at a center area of the semiconductor chip, being connected to the first ground electrodes electrically; and a second power supply electrode, which is formed on the main surface at an area adjacent to the center area of the semiconductor chip between the first power supply electrodes and the second ground electrode, encompassing the second ground electrode, the second power supply electrode being connected to the first power supply electrodes.

19. A semiconductor device having a substrate and a semiconductor chip, comprising: the substrate having opposite first and second surfaces, the second surface including a chip-mounting area where semiconductor chip is mounted;

a plurality of signal terminals formed on the second surface at the outside of the chip-mounting area;

a power supply terminal formed on the second surface between the chip mounting area and the signal terminals; and a ground terminal formed on the second surface between the chip mounting area and the signal terminals; and the semiconductor chip having a main surface having a plurality of sides;

a plurality of signal electrodes formed on the main surface along the sides, the signal electrodes along one of the sides being disposed in a first area having a first length, and each signal electrode being connected to one of the signal terminals electrically; and a power supply electrode formed on the main surface along the sides, the power supply electrode along the one of the sides being disposed in a second area having a second length, which is longer than the first length, between the one of sides and the signal electrodes, and the power supply electrode being connected to the power supply terminal.

20. A semiconductor device as claimed in claim 19, wherein the power supply electrode substantially encompasses the signal electrodes.

21. A semiconductor device as claimed in claim 19, wherein the power supply electrode is a first power supply electrode, further comprising a second power supply electrode, which is formed on the main surface at an area adjacent to a center area of the semiconductor chip, being connected to the first power supply electrode electrically.

22. A semiconductor device having a substrate and a semiconductor chip, comprising: the substrate having opposite first and second surfaces, the second surface including a chip mounting area where semiconductor chip is mounted;

a plurality of signal terminals formed on the second surface at the outside of the chip mounting area;

a power supply terminal formed on the second surface between the chip mounting area and the signal terminals; and a ground terminal formed on the second surface between the chip mounting area and the signal terminals; and the semiconductor chip having a main surface having a plurality of sides;

a plurality of signal electrodes formed on the main surface along the sides, the signal electrodes along one of the sides being disposed in a first area having a first length, and each signal electrode being connected to one of the signal terminals electrically; and a ground electrode formed on the main surface along the sides, the ground electrode along the one of the sides being disposed in a third area having a third length, which is longer than the first length, between the one of sides and the signal electrodes, and the ground electrode being connected to the ground terminal.

23. A semiconductor device as claimed in claim 22, wherein the ground electrode substantially encompasses the signal electrodes.

24. A semiconductor device as claimed in claim 22, wherein the ground electrode is a first ground electrode, further comprising a second ground electrode, which is formed on the main surface at a center area of the semiconductor chip, being connected to the first ground electrode electrically.

25. A semiconductor device having a substrate and a semiconductor chip, comprising: the substrate having opposite first and second surfaces, the second surface including an chip-mounting area where semiconductor chip is mounted;

a plurality of signal terminals formed on the second surface at the outside of the chip-mounting area;

a power supply terminal formed on the second surface between the chip mounting area and the signal terminals; and a ground terminal formed on the second surface between the chip mounting area and the signal terminals; and the semiconductor chip having a main surface having a plurality of sides;

a plurality of signal electrodes formed on the main surface along the sides, the signal electrodes along one of the sides being disposed in a first area having first length, and each signal electrode being connected to one of the signal terminals electrically;

a power supply electrode formed on the main surface along the sides, the power supply electrode along the one of the sides being disposed in a second area having a second length, which is longer than the first length, between the one of the sides and the signal electrodes, and the power supply electrode being connected to the power supply terminal, and a ground electrode formed on the main surface along the sides, the ground electrode along the one of the sides being disposed in a third area having a third length, which is longer than the first length, between the one of the sides and the signal electrodes, and the ground electrode being connected to the ground terminal.

26. A semiconductor device as claimed in claim 25, wherein the power supply electrode substantially encompasses the signal electrodes.

27. A semiconductor device as claimed in claim 25, wherein the ground electrode substantially encompasses the signal electrodes.

28. A semiconductor device as claimed in claim 25, wherein the power supply electrode substantially encompasses the signal electrodes, and wherein the ground electrode substantially encompasses the power supply electrode.

29. A semiconductor chip as claimed in claim 25, wherein the power supply electrode is a first power supply electrode, further comprising a second power supply electrode, which is formed on the main surface at an area adjacent to a center area of the semiconductor chip, being connected to the first power supply electrode electrically.

30. A semiconductor device as claimed in claim 25, wherein the ground electrode is a first ground electrode, further comprising a second ground electrode, which is formed on the main surface at a center area of the semiconductor chip, being connected to the first ground electrode electrically.

31. A semiconductor device as claimed in claim 28, wherein the ground electrode is a first ground electrode and the power supply electrode is a first power supply electrode, further comprising a second ground electrode, which is formed on the main surface at a center area of the semiconductor chip, being connected to the first ground electrode electrically; and a second power supply electrode, which is formed on the main surface at an area adjacent to the center area of the semiconductor chip between the first power supply electrode and the second ground electrode, encompassing the second ground electrode, and the second power supply electrode being connected to the first power supply electrode.

32. A semiconductor device having a substrate and a semiconductor chip, comprising: the substrate having opposite first and second surfaces, the second surface including a chip-mounting area where semiconductor chip is mounted;

a plurality of signal terminals formed on the second surface at the outside of the chip-mounting area;

a power supply terminal formed on the second surface between the chip mounting area and the signal terminals; and a ground terminal formed on the second surface between the chip mounting area and the signal terminals; and the semiconductor chip having a main surface having a plurality of sides;

a plurality of signal electrodes formed on the main surface along the sides, the signal electrodes alone one of the sides being disposed in a first area having a first length, and each signal electrode being connected to one of the signal terminals electrically;

a plurality of power supply electrodes formed on the main surface along the sides, the power supply electrodes along the one of the sides being disposed between the sides and the signal electrodes, and being disposed in a single line, and each power supply electrode being connected to one of the power supply terminals; and a plurality of ground electrodes formed on the main surface along the sides, the ground electrodes along the one of the sides being disposed between the one of the sides and the signal electrodes, and being disposed in the single line, each ground electrode being connected to one of the ground terminals, and the power supply electrodes and the ground electrodes along the one of the sides being disposed alternatingly in the single line in a fourth area having a fourth length, which is longer than the first length.

33. A semiconductor device as claimed in claim 32, wherein the power supply electrodes and the ground electrodes substantially encompasses the signal electrodes.

34. A semiconductor device as claimed in claim 32, wherein the power supply electrodes are first power supply electrodes, further comprising a second power supply electrode, which is formed on the main surface at an area adjacent to a center area of the semiconductor chip, being connected to the first power supply electrodes electrically.

35. A semiconductor memory as claimed in claim 32, wherein the ground electrodes are first ground electrodes, further comprising a second ground electrode, which is formed on the main surface at a center area of the semiconductor chip, being connected to the first ground electrodes electrically.

36. A semiconductor chip as claimed in claim 32, wherein the ground electrodes are first ground electrodes and the power supply electrodes are first power supply electrodes, further comprising a second ground electrode, which is formed on the main surface at a center area of the semiconductor chip, being connected to the first ground electrodes electrically; and a second power supply electrode, which is formed on the main surface at an area adjacent to the center area of the semiconductor chip between the first power supply electrodes and the second ground electrode, encompassing the second ground electrode, and the second power supply electrode being connected to the first power supply electrodes.

* * * * *